ELECTRICAL CIRCUIT ELEMENT

Filed May 28, 1962

2 Sheets-Sheet 1

INVENTORS.
HARVEY ROSENBERG
EDWIN S. LEE III
BY Charles R. Lepchinsky
ATTORNEY

ELECTRICAL CIRCUIT ELEMENT

Filed May 28, 1962

INVENTORS.
HARVEY ROSENBERG
EDWIN S. LEE III
BY
Charles R. Lepchinsky
ATTORNEY

United States Patent Office 3,283,282
Patented Nov. 1, 1966

3,283,282
ELECTRICAL CIRCUIT ELEMENT
Harvey Rosenberg, Drexel Hill, Pa., and Edwin S. Lee III, Altadena, Calif., assignors to Burroughs Corporation, Detroit, Mich., a corporation of Michigan
Filed May 28, 1962, Ser. No. 198,329
38 Claims. (Cl. 338—32)

Figure 1:
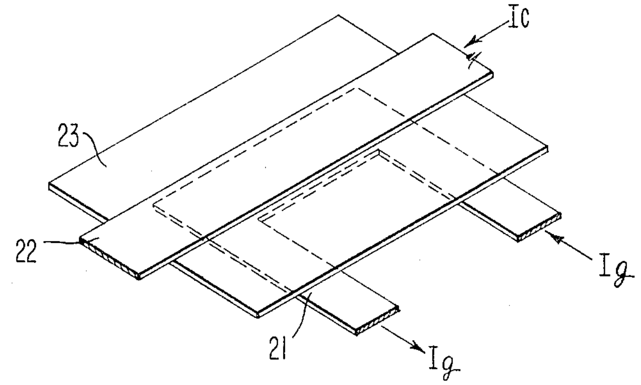
FIG.1 PRIOR ART

This invention relates to electrical circuit elements and more particularly to superconducting circuit elements such as cryotrons.

The cryotron, a relatively new development in the electronics art, utilizes the superconductive characteristics displayed by certain materials when held under conditions of very low temperature. In the absence of a magnetic field, certain materials will change from a resistive state to a superconducting state, in which their electrical resistance is zero, as their temperature is reduced below a certain critical temperature. A magnetic field applied to such materials will lower the temperature at which the transition from a resistive state to a superconducting state occurs. Conversely, if a superconducting material is held at a constant temperature, a magnetic field of sufficient density will cause the superconducting material to enter the resistive or normal state.

A thin film cryotron is a four terminal switching device which utilizes these properties of superconducting materials and comprises, essentially, a gate portion and a control portion. A current passed through the control portion creates a magnetic field that controls the resistivity of the gate element. The cryotron is generally used as a switch having two positions. One position being the zero resistance or superconducting state of the gate portion and the other being the resistive state or position. If a current of sufficient magnitude is applied to the control, the magnetic field produced thereby will cause the gate to transfer from the superconducting position to the resistive state or position. Thus the control and gate form an electrically operated switch which can be changed from a superconductive to a resistive state by the application of a current to the control.

Heretofore cryotrons having a variable gate resistance have only been obtained by applying a fixed biasing magnetic field to the gate to bias the gate between the superconducting and resistive states. The biasing field is such that the gate is not superconducting and yet not sufficinet to cause the gate to enter the resistive or normal state. Slight current variations in the control are used to vary a resultant magnetic field applied to the gate, thereby varying the resistance of the gate.

It has been found that for this type of operation the gate is extremely sensitive to slight changes in the applied magnetic field and to the small current variations in the control. Also, it is very difficult to maintain the fixed biasing magnetic field. Further, the useful variation of gate resistance obtained in this manner is very small.

The present invention eliminates these and other problems by providing a novel thin film cryotron wherein the resistance of the gate is a function of the control current, the geometry of the control, and, if desired, a function of the gate geometry. By using various geometric shapes for the gate and/or the control, the gate resistance is also easily varied over a wide range. The subject invention eliminates critical biasing magnetic fields and permits the design of cryotrons wherein the gate resistance can be a particular function of the control current. Also, the novel cryotron comprising the subject invention can perform circuit functions that cannot be obtained with prior art cryotrons.

Accordingly, an object of this invention is to provide a new cryotron.

Another object is to provide an improved thin film cryotron.

Another object is to provide a cryotron wherein the gate resistance is a function of control current.

A further object of this invention is to provide a cryotron wherein the gate resistance is designed to be a particular function of control current.

Still another object it to provide a cryogenic device wherein the gate resistance can be varied over a wide range without the use of critical biasing magnetic fields.

A still further object of the present invention is to provide a cryotron capable of performing circuit functions heretofore unobtainable with prior art cryotrons.

The exact nature of this invention as well as other objects and advantages thereof will be readily apparent from consideration of the following specification relating to the annexed drawings which disclose by way of example the principle of the present invention and wherein:

FIGURE 1 is a perspective view illustrating a typical thin film in line cryotron; and FIGURES 2 through 12 are views illustrating examples of various embodiments of the present invention.

The basic physical structure of a typical prior art thin film in line cryotron is seen in FIGURE 1 to comprise an evaporated gate element 21, made of a suitable material such as tin. Along the length of the gate 21 is an evaporated control 22 having a width at least equal to the gate 21 and which is made of a suitable material such as lead. The gate 21 and the control 22 are insulated from each other by means of an evaporated film of insulating material 23 which may be silicon monoxide. The complete cryotron is deposited on the flat surface of a support or substrate (not shown) of glass or other insulating material and the entire cryotron is immersed in liquid helium in order to obtain the low temperature necessary to render the gate 21 and the control 22 superconducting.

The operation of the cryotron is such that the superconducting gate element 21 can be made resistive by means of a magnetic field generated by passing a current through the control 22. This results from known physical phenomenon whereby any superconductor can be switched into the resistive state when subjected to a magnetic field greater than a so called "critical" value. The effect of the magnetic field is such that the gate area substantially immediately under the control 22 becomes resistive. The control 22 always remains superconducting unless the current it carries exceeds a certain value such as to cause the control to become resistive. As mentioned hereinabove it is possible, although very difficult, to bias the gate 21 intermediate the normal or resistive state and the superconducting state and vary the gate resistance by applying a varying current through the control 22. The biasing field for this type of operation is critical and only a small useable variation of gate resistance is obtained.

Figure 2:
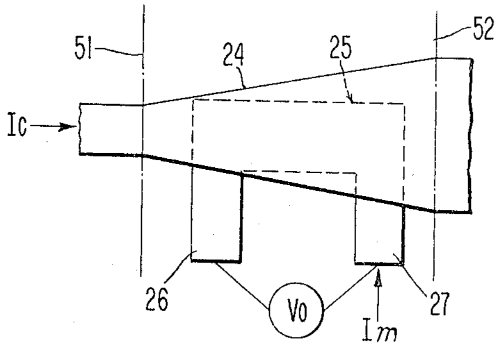

These and other objections are overcome, with resulting advantages and versatility, by the present invention, an embodiment of which is shown in FIGURE 2 wherein there is shown a gate 25, substantially the same as gate 21 of FIGURE 1, but having a tapered control 24. For purposes of clarity, an evaporated film of insulating material is not shown between the gate 25 and the control 24, it being understood that such an insulating film 23 as shown in FIGURE 1 is necessary for the proper operation of this and the other embodiments of the present invention as shown in the remaining figures and as discussed more fully hereinafter. In each of the remaining figures the control is an elongated conductor, the cross-sectional area of which varies from point to point along its length. This means that, when an electric current is passed through this conductor, the current density at any one time will vary from point to point along its length in inverse relation to its cross-sectional area. The flux density and the intensity of the magnetic field adjacent to the control will be directly proportional to the current density.

Since the magnetic field at any point along the length of the tapered control is directly proportional to the control current I$c$ and inversely proportional to the width of the tapered control 24 at the point being considered, as the control current I$c$ is increased from a zero value, the critical field for the gate 25 will be reached at the narrow portion of the tapered control first, progressively switching more of the gate film into the resistive or normal state as the control current I$c$ is increased. As the control current I$c$ increases progressively switching more of the gate 25 into the resistive or normal state the total resistance of the gate 25 also increases. That is, for zero control current I$c$ the gate 25 is superconducting and has no resistance. For a given value of control current I$c$ in the tapered control 24, the gate 25 is partly resistive and has a predetermined resistance. For a higher given value of control current I$c$ in the tapered control 24, the gate has a larger portion of its area in the resistive state thereby causing the gate 25 to have a correspondingly higher fixed resistance etc. This continues until the entire gate 25 area, which is a substantially rectangular area under the tapered cryotron 24, is resistive at which time the resistance of the gate 25 is at a maximum.

It is clear that the resistance of the gate 25, of the cryotron shown in FIGURE 2, is a linear function of the control current I$c$. Thus the resistance of the gate 25 can be varied over a wide range simply by varying the control current I$c$ in the tapered control 24 over a relatively wide range. Since the gate 25 is completely covered by the tapered control 24, the entire gate area can be made resistive. This is accomplished without the necessity of any critical biasing fields as required by prior art devices.

The novel cryotron illustrated in FIGURE 2 can perform circuit functions unobtainable by prior art cryotron devices. For example it may be utilized to give an analog output voltage. This is accomplished by serially connecting the tapered control 24 in a superconducting circuit to be monitored and applying a measuring current I$m$ to the gate 25. Since the resistance of the substantially rectangular gate 25 area under the tapered control 24 is proportional to the control current I$c$ which also flows in the monitored circuit, a voltage drop V$o$ appears between the ends 26 and 27 of the gate 25 which is proportional to the current flowing through the monitored circuit.

It will also be clear to those skilled in the art that a varying control current I$c$ flowing through the tapered control 24 will be faithfully reproduced with no phase shift, as a varying voltage across the gate 25 due to the measuring current I$m$. That is, the tapered control cryotron may be utilizide as an amplifier having no phase inversion of the input signal.

Figure 3:
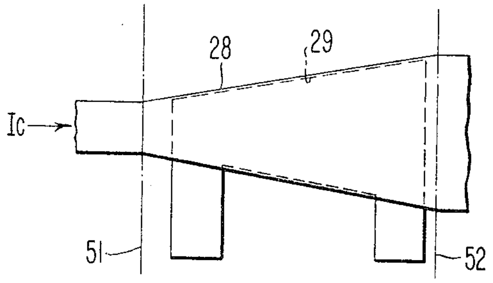

A variation on the tapered control cryotron of FIGURE 2 is illustrated in FIGURE 3 wherein there is shown a cryotron having both a tapered control 28 and a tapered gate 29. The operation of this cryotron is similar to that of the tapered control cryotron described above, except that as the boundary between the normal or resistive area and the superconducting area is moved toward the wide end of the gate 29 due to an increasing control current I$c$ in the tapered control 28, the resistance of the gate does not increase in a linear manner. This is due to the fact that the resistance of the gate 29 is inversely proportional to its width. Therefore, the narrower portion of the gate has a higher resistance when it is not superconducting than does a wider section of the gate that is not superconducting.

Figure 4:
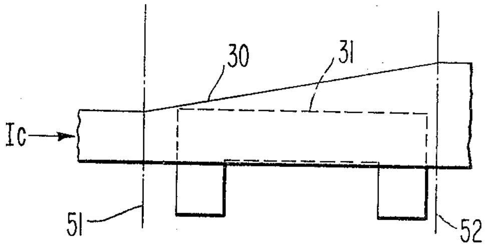
Figure 5:
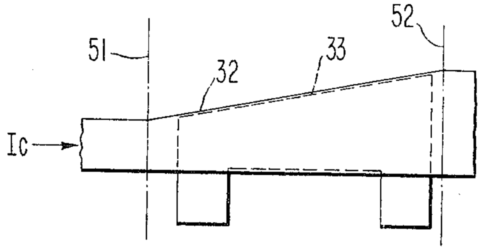
Figure 6:
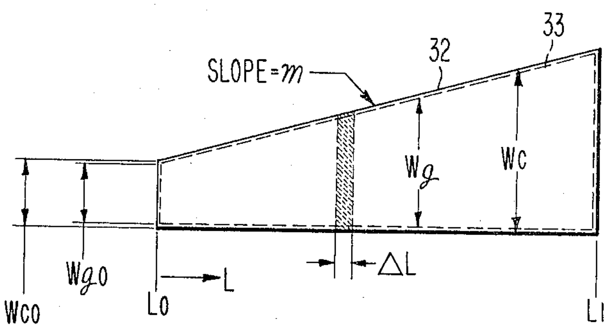

Further variations on a tapered cryotron are shown in FIGURES 4 and 5. There is illustrated in FIGURE 4 a cryotron having one side of its control 30 tapered and which utilizes a substantially rectangular gate 31. FIGURE 5 illustrates a cryotron having one side of its control 32 tapered and the corresponding side of its gate 33 also tapered. The operation of these cryotrons is similar to the operation of the cryotrons shown in FIGURES 2 and 3. By way of example, an analysis of the tapered cryotron shown in FIGURE 5 is set forth with reference to FIGURE 6, which illustrates the outline of the control and gate portions of the cryotron shown in FIGURE 5. Consider first the approximate rectangle of width ΔL. The gate resistance R$g$ covered by this area is given by the expression:

$$Rg=P\frac{\Delta L}{A}$$

where P is the resistivity of the gate material and A is the cross sectional area of the gate. The cross sectional area A equals the width W$g$ of the gate at the area being considered, times the thickness $dg$ of the gate material. Accordingly, the expression for the gate resistance may be written as:

$$Rg=P\frac{\Delta L}{Wgdg}$$

The width W$g$ of the gate at any point along the length L of the gate can be expressed by:

$$Wg=mL+Wgo$$

where $m$ is the slope of the tapered side of the gate 33 and W$go$ is the initial width of the tapered gate 33. By substituting this expression for the width W$g$ of the gate in the equation for the gate resistance R$g$ we obtain:

$$Rg=P\frac{\Delta L}{(mL+Wgo)dg}=k\frac{\Delta L}{mL+Wgo}$$

where the constant $k$ equals the resistivity P divided by the thickness $dg$ of the gate. To obtain the resistance of the entire gate 33 area the equation given above is integrated between the limits of $L_0$ and $L_1$, which represent each end of the gate 33, as follows:

$$Rg=k\int_{L_0}^{L_1}\frac{L}{ml+Wgo}=\frac{k}{m}\ln\left(\frac{mL_1+Wgo}{Wgo}\right)$$

Since the critical field H$i$ at the boundary between the superconducting and resistive or normal areas of the gate equals the control current I$c$ divided by the width W$i$ of the control at the boundary, and since the width W$i$ of the control can be expressed as:

$$Wi=mL+Wco$$

we can obtain the following equation:

$$Hi=\frac{Ic}{mL+Wco}$$

where W$co$ is the initial width of the control and $m$ is the slope of the tapered side of the control. Solving this expression for L we obtain:

$$L=\frac{l}{m}\left[\frac{Ic}{Hi}-Wco\right]$$

Since this expression for L covers the area from, and including, $L_0$ to, and including $L_1$, it may be substituted for $L_1$ in the last expression of gate resistance R$g$ given above resulting in:

$$Rg=\frac{k}{m}\ln\left(\frac{\frac{Ic}{Hi}-Wco+Wgo}{Wgo}\right)$$

Assuming that the gate 33 and control 32 have identical dimensions, this reduces to:

$$Rg=\frac{k}{m}\ln\frac{Ic}{HiWgo}$$

This expression shows that the gate resistance R$g$ of the cryotron shown in FIGURE 5 is a function of the natural log of the control current I$c$. It is apparent from the detailed descriptions given above that all sorts of relationships between gate resistance $R_g$ and control current $I_c$ may be obtained by selection of appropriate control and gate geometries in accordance with the principles of the present invention.

The cryotron shown in FIGURE 5 can be utilized as a means for adding the natural logarithms of a plurality of variables, a function not obtainable with prior art cryotrons. This can be accomplished by serially connecting the gates of a plurality of cryotrons, such as that shown in FIGURE 5, to a source of measuring current. By connecting the control of each such cryotron to a separate variable, represented by a varying current, the total voltage drop across the plurality of gate elements, due to the measuring current, will be proportional to the sum of the natural logarithms of the variables.

Throughout this specification, the control of the cryotrons shown in FIGURES 2–12 will be described as having a geometric shape as defined within the boundaries of the reference lines 51 and 52, i.e. the active portion of the control that influences the resistivity of the gate elements.

The cryotrons illustrated in FIGURES 2, 3, 4 and 5 are examples of cryotrons whose gate and/or control element between the reference lines 51 and 52 have a geometric shape which may be defined as comprising a plurality of sides intersecting in a plurality of angles at least one of which is an acute angle. It will be obvious to those skilled in the art that other geometric shapes of the class defined, other than that illustrated in FIGURES 2, 3, 4 and 5 and coming within the scope of the present invention, can be used to obtain gate resistances as various functions of control current.

Figure 7:
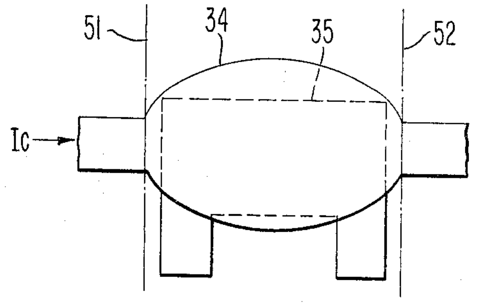
Figure 8:
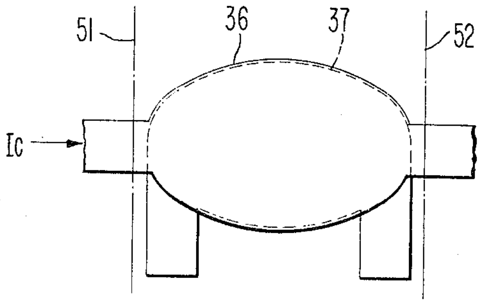

FIGURES 7 and 8 illustrate, by way of example only, cryotrons having a gate and/or control geometry between the reference lines 51 and 52 which may be defined as being bounded by at least one curve. Referring now to FIGURE 7, there is shown a cryotron having a substantially rectangular gate 35 and a substantially elliptical control 34. As explained hereinabove, as the control current $I_c$ increases, the gate critical field will be reached at the narrow portion of the control first, progressively switching more of the gate into the resistive or normal state as the control current increases. Therefore as tne control current is increased, the opposite ends of the gate 35 will become resistive. There will be two boundaries, one at each end of the gate 35, between the superconducting and resistive areas of the gate 35 which will move toward the center of the gate as the control current $I_c$ is increased.

A variation of the cryotron shown in FIGURE 7 is illustrated in FIGURE 8 wherein there is shown a cryotron having an elliptical control 36 and an elliptical gate 37. Since the resistance of the gate 37 is inversely proportional to its width, the resistance of the gate 37 will increase by decreasing increments as the control current $I_c$ is increased.

Figure 9:
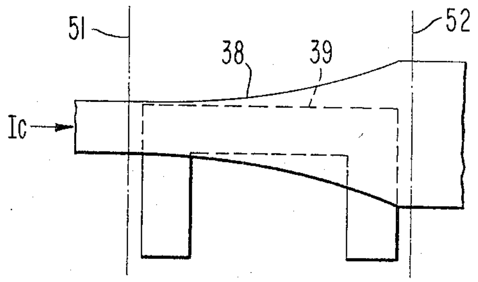
Figure 10:
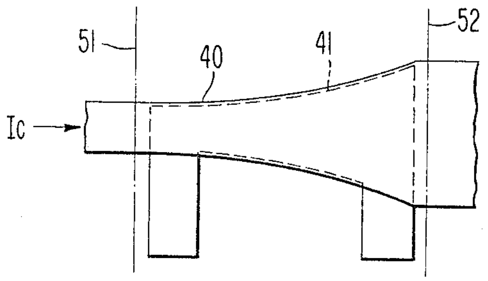

The cryotrons illustrated in FIGURES 9 and 10 show, by way of example, cryotrons having a gate and/or a control geometry between the reference lines 51 and 52 which may be described as bounded by a plurality of side surfaces at least one of which is a curve. There is shown in FIGURE 9 a cryotron including a substantially rectangular gate area 39 and a control 38 having sides exhibiting an exponential curve. FIGURE 10 illustrates a cryotron having a gate 40 and a control 41 of the same geometric shape as the control 38 of the cryotron shown in FIGURE 9. The operation of the cryotrons shown in FIGURES 9 and 10 is similar to that of the cryotrons shown in FIGURES 4 and 5 respectively except that the gate resistance will be a different function of control current due to the different control and gate geometries used in the cryotrons illustrated in FIGURES 9 and 10 in comparison to those of FIGURES 4 and 5.

Figure 11:
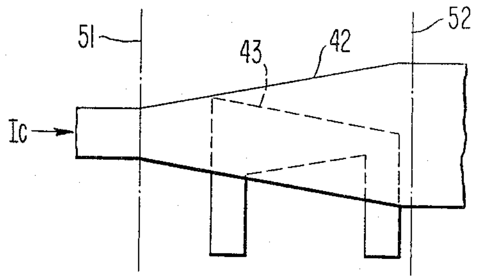
Figure 12:
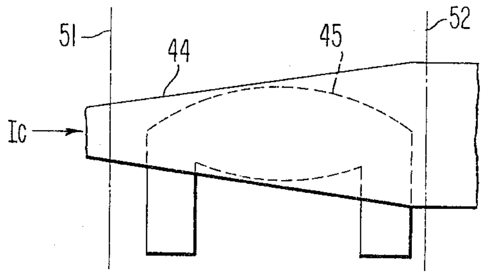

Heretofore herein cryotrons having substantially rectangular gate areas, or gate areas having a geometric shape substantially the same as the control, have been described. In accordance with the principles of the present invention, a great variety of functions of gate resistance versus control current may be realized by utilizing a nonrectangular gate area that has a geometric shape different from the control. For example there is shown in FIGURE 11 a cryotron having a tapered control 42 and an oppositely tapered gate 43. FIGURE 12 illustrates a cryotron having a tapered control 44 and an elliptical gate 45. It would be impossible to illustrate all of the geometric shapes that could be derived in accordance with the principles of the present invention and it is to be understood that those illustrated in FIGURES 2 through 12 are shown by way of example only and are not intended to and do not limit the present invention.

What has been described is a novel thin film cryotron wherein various functions of gate resistance versus control current are obtainable by utilizing various gate and/or control geometries. Such cryotrons are able to perform circuit functions unobtainable with prior are cryotrons and it can be expected that other unobvious uses will be found for the novel cryotron comprising the subject matter of the present invention.

What is claimed is:

1. A variable resistance thin film cryotron comprising:

(a) a superconducting variable resistance gate having a characteristic critical magnetic field and providing a substantially rectangular gate area, magnetically coupled to (b) a control element whose active portion spans said gate area and has a plurality of sides the intersections of which define a plurality of angles at least one of which is an acute angle.

2. A thin film cryotron comprising:

(a) a superconducting gate film having a predetermined critical magnetic field and providing a substantially rectangular gate area magnetically coupled to (b) a control including an active area which is at least as wide as said gate area and has two opposite tapered sides, (c) said gate and said control being positioned relative to one another such that the magnitude of the gate resistance is determined by the magnetic of a current in said control.

3. A thin film cryotron comprising:

(a) a superconducting gate film having a characteristic critical magnetic field and providing a substantially rectangular gate area magnetically coupled to (b) a control having a plurality of sides one of which defines a taper, the active portion of which bridges said gate area, (c) said control and said gate positioned relative to resistance is determined by the magnetude of a current in said control.

4. The combination comprising:

(a) gate means, having an input and an output, for changing the effective electrical resistance between said input and said output as a function of variation in the resistivity of the portion of said gate means that is subjected to an energy field having a flux density greater than its critical magnetic flux density; and (b) uniformly conductive control means, in magnetic relationship with said gate means, for applying an energy field having a flux density greater than said critical magnetic flux density over any of a plurality of substantially different size portions of said gate means as a result of different levels of current in said control means.

5. The combination as defined in claim 4 in which said energy field is derived from a source of electrical energy and the flux density of the energy field applied by the control means varies along the gate means between its input and output.

6. The combination as defined in claim 5 in which said control means comprises a conductor having a cross-sectional area which varies from point to point along the length of its active portion, which conductor is adapted to have an electric voltage impressed across it, whereby the current density in said conductor will vary from point to point along the length of said conductor in inverse proportion to its cross-sectional area.

7. A cryotron in accordance with the invention of claim 34 comprising:

(a) means for providing a variable gate resistance further comprising (b) a thin film superconductive gate which is bounded by a plurality of sides at least one of which is a curve and at least one of which is a straight line, magnetically coupled to (c) a thin film control which spans said gate and is bounded by a plurality of sides at least one of which is a curve and at least one of which is a straight line.

8. The combination defined in claim 7 wherein said control is substantially coextensive with said gate.

9. A cryotron in accordance with the invention of claim 4 comprising:

(a) means for providing a gate resistance which is a particular function of control current further comprising (b) a superconductive thin film gate the active portion of which has a plurality of sides the intersections of which define a plurality of angles at least one of which is an acute angle, magnetically coupled to (c) a thin film control including an active area having a geometric shape which is bounded by at least one curvilinear edge.

10. A variable resistance cryotron in accordance with the invention of claim 4 comprising:

(a) a variable resistance gate the active portion of which has a geometric shape which is bounded by at least one curvilinear edge, magnetically coupled to (b) a control including an active area having a plurality of sides the intersections of which define a plurality of angles at least one of which is an acute angle.

11. The combination defined in claim 10 wherein the active area of said control is substantially coextensive with the active portion of said gate.

12. A cryogenic device comprising:

(a) a gate element having a characteristic critical magnetic field and adapted to be cooled to its superconductive state; and (b) a control conductor having an input and an output and an active portion, a segment of which is at least as wide as an adjacent segment of said gate element;

(c) the active portion of said control conductor, having a cross-sectional area which varies from point to point along its length being placed in magnetic coupling relationship with said gate element such that portions of said control conductor having different cross-sectional areas are adjacent to different portions of said gate element.

13. A variable resistance thin film cryotron in accordance with the cryogenic device of claim 12 comprising:

(a) a variable resistance superconductive thin film gate the active portion of which has a plurality of sides the intersections of which define a plurality of angles at least one of which is an acute angle, magnetically coupled to (b) a thin film control the active portion of which spans said gate and has a plurality of sides the intersections of which define a plurality of angles at least one of which is an acute angle.

14. A variable resistance thin film cryotron in accordance with the cryogenic device of claim 12 comprising:

(a) a superconductive variable resistance gate film having a substantially rectangular gate area, and (b) a control, magnetically coupled to said gate means and having a geometric shape which is at least as wide as the adjacent portion of the gate film and is bounded by at least one curvilinear edge.

15. The combination defined in claim 14 wherein said control is substantially coextensive with said substantially rectangular gate area.

16. A thin film cryotron in accordance with the cryogenic devices of claim 12 comprising:

(a) means for providing a variable gate resistance further comprising (b) a superconducting gate having an active area which is bounded by at least one curvilinear edge, magnetically coupled to (c) a control including an active area bounded by a plurality of sides at least one of which is a curve and at least one of which is a straight line.

17. A thin film cryotron in accordance with the cryogenic device of claim 12 comprising:

(a) means for providing a variable gate resistance further comprising (b) a superconductive gate bounded by a plurality of sides at least one of which is a curve and at least one of which is a straight line, and (c) a control, magnetically coupled to said gate, and including an active area which is defined by at least one curvilinear edge.

18. The combination defined in claim 17 wherein said control is substantially coextensive with said gate.

19. A cryogenic device comprising:

(a) a gate element having a characteristic critical magnetic field and adapted to be cooled to its superconductive state along a predetermined length;

(b) a power supply terminal electrically connected to one end of said gate element and adapted to receive an electrical voltage;

(c) a load current terminal electrically connected to the other end of said gate element and adapted to provide an amount of current to a load depending upon the resistance of said gate element;

(d) control means, in juxtaposition with and magnetically coupled to said gate element along said predetermined length, for varying the resistance of said gate element as a function of a signal current;

(e) a control-means input terminal electrically connected to one end of said control means and adapted to receive a signal current;

(f) a control-means output terminal electrically connected to the other end of said control means and adapted to receive said signal current;

(g) the active portion of said control means including uniformly conductive conductor means the cross-sectional area of which varies along its length for causing the magnetic field created by each value of said signal current to vary along the predetermined length of said gate element.

20. A thin film cryotron in accordance with the cryogenic device of claim 38 comprising:

(a) a superconductive gate having at least two opposite tapered sides, (b) a control including an active area having two opposite tapered sides, (c) said gate and said control being positioned relative to one another and coupled such that the magnitude of the gate resistance is determined by the magnitude of a current in said control.

21. The combination defined in claim 20 wherein the active area of said control completely covers said gate.

22. A thin film cryotron in accordance with the cryogenic device of claim 19 comprising:

(a) means for providing a variable gate resistance further comprising (b) a superconductive gate having a substantially rectangular gate area, (c) an elliptical control magnetically coupled to said gate, and (d) means to apply a variable current to said elliptical control for varying the resistance of said gate.

23. A thin film cryotron in accordance with the cryogenic device of claim 19 comprising:
(a) an elliptical superconductive gate area,
(b) a control having an elliptical active control area, and
(c) a source of current applied to said control,
(d) said control and said gate being positioned relative to one another and coupled such that the resistance of said gate will increase by decreasing amounts as said current applied to said control is increased.

24. The combination defined in claim 23 wherein the active area of said control completely covers said gate area.

25. A thin film cryotron in accordance with the cryogenic device of claim 19 comprising:
(a) a substantially rectangular thin film gate area,
(b) a thin film control including an active area having a plurality of sides at least one of which is an exponential curve, and
(c) means for applying a variable current to said control,
(d) said gate and said control being positioned relative to one another and coupled such that the resistance of said gate is a function of said control.

26. A thin film cryotron in accordance with the cryogenic device of claim 19 comprising:
(a) a superconductive gate having a plurality of sides at least one of which is an exponential curve,
(b) a control having a plurality of sides at least one of which is an exponential curve, and
(c) means for applying a current to said control,
(d) said gate and said control being positioned relative to one another and coupled such that the resistance of said gate is a function of said current applied to said control.

27. The combination defined in claim 26 wherein said control completely covers said gate.

28. A thin film cryogenic device comprising:
(a) a thin film gate having a predetermined critical magnetic field;
(b) a uniformly conductive thin film control, the active portion of which varies in width along its length;
(c) said control and said gate being positioned relative to one another and magnetically coupled such that the magnetic fields created by different levels of current in said control impinges upon substantially different portions of said gate.

29. A thin film cryogenic device according to claim 28 in which the width of the active portion of said control increases progressively along its length.

30. A thin film cryogenic device according to claim 29 in which the width of the active portion of said gate increases progressively along its length.

31. A thin film cryotron in accordance with claim 28 comprising:
(a) means for providing a variable gate resistance further comprising
(b) a thin film superconductive gate having a geometric shape which is defined by at least one curve, and
(c) a thin film control which is magnetically coupled to said gate and has a geometric shape which is defined by at least one curve.

32. A cryotron in accordance with claim 28 comprising:
(a) means for providing a variable gate resistance further comprising
(b) a superconductive gate having a substantially rectangular thin film gate area, and
(c) a thin film control, which is magnetically coupled to said gate and is bounded by a plurality of sides at least one of which is a curve and at least one of which is a straight line.

33. The combination defined in claim 27 wherein said control is substantially coextensive with said substantially rectangular gate area.

34. A thin film cryotron in accordance with claim 28 comprising:
(a) superconductive means for providing a variable gate resistance further comprising
(b) a thin film gate the active area of which has a plurality of sides the intersections of which define a plurality of angles at least one of which is an acute angle, and
(c) a thin film control, magnetically coupled to the active area of said gate, and including an active area bounded by a plurality of sides at least one of which is a curve and at least one of which is a straight line.

35. A thin film cryotron in accordance with claim 28 comprising:
(a) means for providing a variable gate resistance further comprising
(b) a thin superconductive film gate having an active area bounded by a plurality of sides at least one of which is a curve and at least one of which is a straight line, magnetically coupled to
(c) a thin film control including an active area having a plurality of sides the intersections of which define a plurality of angles at least one of which is an acute angle.

36. The combination defined in claim 35 wherein the active area of said control completely covers the active area of said gate.

37. A thin film cryotron in accordance with claim 28 comprising:
(a) a superconductive gate having a plurality of sides one of which defines a taper,
(b) a control including an active area having a plurality of sides one of which defines a taper,
(c) said control and said gate being positioned relative to each other and coupled such that the resistance of said gate is a particular linear function of a current in said control.

38. The combination defined in claim 37 wherein the active area of said control is substantially coextensive with said gate.

References Cited by the Examiner

UNITED STATES PATENTS

| | | | |
|---|---|---|---|
| 2,832,897 | 4/1958 | Buck. | |
| 2,983,889 | 5/1961 | Green | 338—32 |
| 2,989,714 | 6/1961 | Park et al. | |
| 2,989,716 | 6/1961 | Brennenmann et al. | 338—32 |
| 3,100,267 | 8/1963 | Crowe | 338—32 X |
| 3,138,784 | 6/1964 | Lentz et al. | 338—32 X |
| 3,168,727 | 2/1965 | Schmidlin et al. | 340—173.1 |

RICHARD M. WOOD, *Primary Examiner.*

H. T. POWELL, W. D. BROOKS, *Assistant Examiners.*

UNITED STATES PATENT OFFICE

CERTIFICATE OF CORRECTION

Patent No. 3,283,282 November 1, 1966

Harvey Rosenberg et al.

It is hereby certified that error appears in the above numbered patent requiring correction and that the said Letters Patent should read as corrected below.

Column 1, line 46, for "sufficinet" read -- sufficient --; column 3, line 55, for "utilizide" read -- utilized --; column 6, line 41, for "magnetic" read -- magnitude --; line 50, beginning with "(c) said control" strike out all to and including "in said control." in line 52, and insert instead the following:

(c) said control and said gate positioned relative to one another such that the resistance of said gate is a function of a current in said control.

same column 6, line 61, after "magnetic" insert -- coupling --; column 7, line 7, for "34" read -- 4 --; column 8, line 5, for "devices" read -- device --; line 54, for "38" read -- 19 --; column 10, line 26, for "thin superconductive" read -- superconductive thin --.

Signed and sealed this 5th day of September 1967.

(SEAL)
Attest:

ERNEST W. SWIDER
Attesting Officer

EDWARD J. BRENNER
Commissioner of Patents